United States Patent
Ninomiya et al.

(10) Patent No.: US 7,357,883 B2
(45) Date of Patent: Apr. 15, 2008

(54) CONDUCTIVE ADHESIVE, METHOD OF PRODUCING THE SAME, AND BONDING METHOD

(75) Inventors: Yasunori Ninomiya, Kariya (JP); Masashi Totokawa, Nagoya (JP); Hirokazu Imai, Okazaki (JP); Yukinori Migitaka, Kasugai (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/500,307

(22) Filed: Aug. 8, 2006

(65) Prior Publication Data

US 2007/0075299 A1    Apr. 5, 2007

(30) Foreign Application Priority Data

Oct. 3, 2005    (JP) .............................. 2005-289883

(51) Int. Cl.
*H01B 1/00*    (2006.01)
*H01B 1/12*    (2006.01)

(52) U.S. Cl. .................... 252/500; 428/357; 428/375; 428/671; 428/674; 427/216

(58) Field of Classification Search ................ 252/500; 428/148, 403, 357, 671, 674; 174/88 R, 174/88; 29/832; 257/629; 427/216
See application file for complete search history.

(56) References Cited

U.S. PATENT DOCUMENTS

| | | | | |
|---|---|---|---|---|
| 4,606,962 | A * | 8/1986 | Reylek et al. .............. | 428/148 |
| 4,652,465 | A * | 3/1987 | Koto et al. ................. | 427/216 |
| 4,740,657 | A * | 4/1988 | Tsukagoshi et al. ....... | 174/88 R |
| 5,162,087 | A * | 11/1992 | Fukuzawa et al. ......... | 252/500 |
| 5,213,868 | A * | 5/1993 | Liberty et al. .............. | 428/131 |
| 5,604,026 | A * | 2/1997 | King ....................... | 428/317.1 |
| 6,223,429 | B1 * | 5/2001 | Kaneda et al. ............. | 29/832 |
| 6,329,101 | B1 * | 12/2001 | Kawakami ................ | 429/218.2 |
| 6,375,866 | B1 * | 4/2002 | Paneccasio et al. ........ | 252/511 |
| 6,884,833 | B2 * | 4/2005 | Chheang et al. ........... | 524/445 |
| 7,078,095 | B2 * | 7/2006 | Tam ......................... | 428/352 |
| 2002/0004132 | A1 * | 1/2002 | Banovetz et al. .......... | 428/343 |
| 2005/0034560 | A1 * | 2/2005 | Kuwajima ................. | 75/255 |

(Continued)

FOREIGN PATENT DOCUMENTS

EP    0708582 A1    4/1996

(Continued)

OTHER PUBLICATIONS

Notice of Preliminary Rejection dated Jun. 21, 2007 issued in the corresponding Korean patent application No. 10-2006-0083728.

*Primary Examiner*—Lorna M. Douyon
*Assistant Examiner*—Khanh Tuan Nguyen
(74) *Attorney, Agent, or Firm*—Posz Law Group, PLC

(57) ABSTRACT

A conductive adhesive is formed by mixing a plurality of conductive fillers into a thermosetting resin. The conductive filler includes a core material made of copper-based metal, a coating film made of silver and a plurality of particles made of silver. The coating film is provided on the core material to cover the core material, and the particles are provided on a surface of the coating film. Accordingly, a surface of the core material is prevented from being exposed. The conductive adhesive can be suitably used for bonding two members.

7 Claims, 4 Drawing Sheets

U.S. PATENT DOCUMENTS

| | | | |
|---|---|---|---|
| 2005/0182161 A1* | 8/2005 | Khattar et al. | 523/440 |
| 2006/0145125 A1* | 7/2006 | Kuwajima et al. | 252/500 |
| 2006/0145302 A1* | 7/2006 | Kim et al. | 257/629 |

FOREIGN PATENT DOCUMENTS

| | | | |
|---|---|---|---|
| JP | A-63-301408 | | 12/1988 |
| JP | 06-136333 | * | 5/1994 |
| JP | 06-240464 | * | 8/1994 |
| JP | A-2000-192000 | | 7/2000 |
| JP | A-2001-043729 | | 2/2001 |
| JP | 2001-298049 | * | 10/2001 |
| JP | A-2003-068140 | | 3/2003 |
| JP | A-2003-147316 | | 5/2003 |
| JP | 2005-154861 | * | 6/2005 |

* cited by examiner

|  | TOTAL | | SURFACE | |
|---|---|---|---|---|
|  | Ag | Cu | Ag | Cu |
| SAMPLE 1 | 40 | 60 | 50 | 50 |
| SAMPLE 2 | 50 | 50 | 60 | 40 |
| SAMPLE 3 | 58 | 42 | 72 | 28 |
| SAMPLE 4 | 63 | 37 | 80 | 20 |
| COMPARATIVE EXAMPLE | 77 | 23 | 86 | 14 |

CONDUCTIVE ADHESIVE, METHOD OF PRODUCING THE SAME, AND BONDING METHOD

CROSS REFERENCE TO RELATED APPLICATION

This application is based on Japanese Patent Application No. 2005-289883 filed on Oct. 3, 2005, the disclosure of which is incorporated herein by reference in its entirety.

BACKGROUND OF THE INVENTION

1. Field of the Invention

The present invention relates to a conductive adhesive formed by mixing conductive fillers into resin. The conductive filler can be made by providing silver particles on a core material made of copper-based metal (copper or an alloy including copper). The conductive adhesive can be suitably used for bonding two members.

2. Description of Related Arts

Generally, a conductive adhesive is a mixture of resin for performing a bonding and conductive fillers for providing an electrical conductivity. Specifically, the conductive adhesive is formed by mixing the conductive fillers made of copper and/or silver into thermosetting resin, e.g., epoxy resin. For example, the conductive adhesive is used for an electrical connection between an electronic part and a substrate.

JP-A-2003-68140 and JP-A-2001-43729 disclose conductive adhesives, in which conductive fillers formed by covering a surface of a core material made of copper-based metal with particles (e.g., powder) made of silver are used.

After the conductive adhesive is coated on an electrode of a connecting portion, the resin in the conductive adhesive is heated so as to be hardened. The resin is contracted due to the hardening so that the conductive fillers contact with each other, and the conductive filler and the electrode contact with each other, thereby an electrical conduction can be performed.

In the conductive adhesive using the conductive filler, a specific surface area of the conductive fillers can be large due to the silver particles. Moreover, the conductive adhesive can be sintered at a lower temperature due to the silver particles, a melting point of which is relatively low.

Accordingly, a metallic junction, i.e., metallic bonding, of the silver particles can be formed as a filler connection, thereby a reliability of the filler connection is higher than that of a contact conduction.

In the conventional conductive adhesive using the conductive filler formed by covering the surface of the core material made of the copper-based metal with the particles made of the silver, a potential difference between the filler and a tin (Sn) electrode used for the electronic part is made to be low by using the copper-based metal for the core material. Thus, a galvanic corrosion can be prevented.

However, because the surface of the core material is coated with the silver particles, the surface of the core material made of copper is easy to be exposed from a clearance between silver particles. Therefore, the exposed part of the copper is easy to be oxidized.

Further, when a bonding is performed by using the conductive adhesive, in which the copper is oxidized, the metallic junction of the fillers by the silver particles is difficult to be formed due to the copper oxide film on the fillers.

Accordingly, after the bonding, the junction between fillers becomes inadequate. Thus, an electrical resistance of the conductive adhesive may be increased. Further, when the copper oxidation proceeds by heat, the resistance may be more increased.

SUMMARY OF THE INVENTION

In view of the foregoing and other problems, it is an object of the present invention to provide a conductive adhesive including conductive fillers, which can prevent a surface of a core material from being exposed between particles. It is another object of the present invention to provide a method of producing a conductive adhesive with a coating film on a core material. It is further another object of the present invention to provide a bonding method for bonding first and second members.

According to a first example of the present invention, a conductive adhesive is formed by mixing a plurality of conductive fillers into a thermosetting resin. The conductive filler includes a core material made of a copper-based metal, a coating film made of silver, in which the coating film is provided on the core material and covers the core material, and a plurality of particles made of silver, in which the particles are provided on a surface of the coating film.

According to a second example of the present invention, a method of producing a conductive adhesive includes a step of forming a plurality of conductive fillers and a step of adding the conductive fillers into a thermosetting resin. The step of forming includes a process of forming a core material using a copper-based metal, a process of forming a coating film on the core material to cover the core material, using silver, and a process of forming a plurality of particles on the surface of the coating film, using silver.

According to a third example of the present invention, a bonding method includes a step of preparing a conductive adhesive formed by mixing a plurality of conductive fillers into a thermosetting resin, a step of providing the conductive adhesive between first and second members, and a step of heating the conductive adhesive so as to harden the resin and sinter the particles while keeping the coating film on the core material. The conductive filler includes a core material made of a copper-based metal, a coating film made of silver provided on the core material to cover the core material, and a plurality of particles made of silver provided on a surface of the coating film.

According to the first and second examples, the surface of the core material is prevented from being exposed between the particles.

According to the third example, the conductive adhesive can be suitably used for bonding two members while it can prevent the surface of the core material from being exposed between the particles.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

Figure 1A:
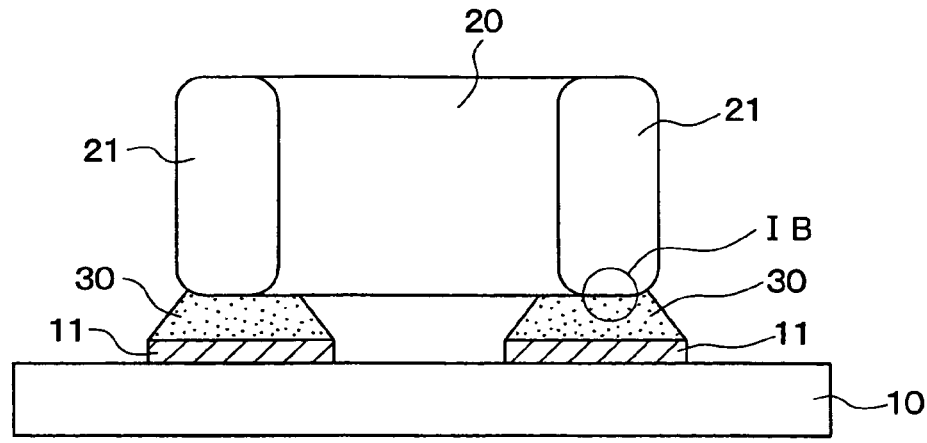
FIG. 1A is a schematic cross-sectional view showing an electronic part, which is mounted by using a conductive adhesive according to an embodiment of the present invention.

FIG. 1A is a schematic cross-sectional view showing a bonding state of an electronic part 20 to a circuit board 10 using a conductive adhesive 30 according to an embodiment of the present invention. As shown in FIG. 1A, an electrode 11 (hereinafter referred to as a board electrode 11) of the circuit board 10 and an electrode 21 (hereinafter referred to as a part electrode 21) of the electronic part 20 are electrically connected through the conductive adhesive 30.

The circuit board 10 may be a ceramic board, a print board or a lead frame, for example. The circuit board 10 is not especially limited. The board electrode 11 is formed on a surface of the circuit board 10, and made of a thick film or a plating using a material such as silver-based metal, copper-based metal, nickel-based metal or gold.

Surface members, e.g., a capacitor, a resistor and a semiconductor element, can be used for the electronic part 20. In the example shown in FIG. 1A, a chip capacitor is used for the electronic part 20. Further, the part electrode 21 is made of Sn-based base metal. For example, an Sn-plated electrode is used for the part electrode 21 in the embodiment.

The conductive adhesive 30 is formed by mixing conductive fillers 32 into a thermosetting resin 31. The resin 31 may be any resins used for general thermosetting conductive adhesives. Most of the resins are hardened at the temperature of equal to or less than 200° C., generally, the temperature is about 150° C.

For example, the resin 31 is composed of an epoxy resin having a naphthalene skeleton as a base resin, an acid anhydride and a phenol resin as hardening agents, and imidazole as a hardening accelerator.

The conductive filler 32 includes a core material 32$a$ made of copper-based metal, a coating film 32$b$ made of silver, and particles 32$c$ made of silver. The coating film 32$b$ covers a surface of the core material 32$a$, and the particles 32$c$ are provided on a surface of the coating film 32$b$.

Copper or an alloy including copper, e.g., an alloy of copper and silver, can be used as the copper-based metal for forming the core material 32$a$. As an example, copper is used as the copper-based metal in the embodiment. Moreover, the core material 32$a$ may be scale-shaped or sphere-shaped. A maximum length of the core material 32$a$ is about 25 μm. The size of the core material 32$a$ is usually some micrometers.

Further, the silver for forming the coating film 32$b$ and the particles 32$c$ is a simple silver in industrial use. The silver may include impurities in an ordinary range. Moreover, a thickness of the coating film 32$b$ is between 100 nm and 10 μm by SEM analysis of the cross-section of the coating film 32$b$. The thickness of the coating film 32$b$ may be set in a range between 100 nm and 1 μm.

Furthermore, a diameter of the particle 32$c$ is about 1-100 nm, which can be measured as a usual crystallite diameter by a particle size distribution. When the diameters of the silver particles 32$c$ are in the nanometer orders, the particles 32$c$ can be sintered at the temperature for hardening the resin 31. Therefore, the conductive filler 32 can be realized, in which an adequate specific surface area can be secured, and the sintering can be performed at the lower temperature.

The conductive filler 32 is formed as follow: the core material 32$a$ is formed by a general wet process or an atomize method; the coating film 32$b$ is formed on the core material 32$a$ by an electrochemical method such as a general substitutive precipitation or an electroless plating; and the particles 32$c$ are formed by a general reductive precipitation method.

In addition, when the core material 32$a$ is formed by the wet process, the diameter of the core material 32$a$ can be controlled easily, and the core material 32$a$ is easy to be formed in scale-shaped. Generally, the contact state of the fillers can be maintained stably, when the core material 32$a$ is formed into the scale-shaped.

Figure 2A:
FIGS. 2A-2C are schematic process views showing a producing method of the conductive filler according to the embodiment.
Figure 2B:
Figure 2C:
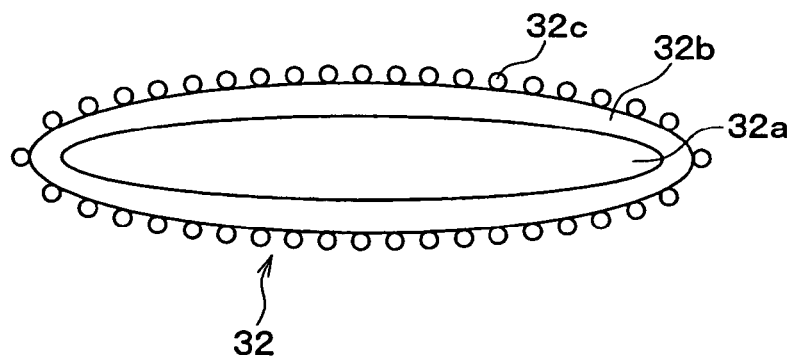

Next, a producing method of the conductive filler 32 will be described in detail with reference to FIGS. 2A-2C. FIGS. 2A-2C are schematic process views showing the producing method of the conductive filler 32 in the embodiment.

As the wet process, the core material 32$a$ is precipitated by adding a reducing agent such as hydrazine or formalin into a copper complex solution such as copper sulfate or copper nitrate (refer to FIG. 2A). After the core material 32$a$ is washed with sulfuric acid, the core material 32$a$ is put into a silver nitrate solution. Thus, a silver film, i.e., the coating film 32$b$, is substitutively precipitated on the surface of the core material 32$a$ (refer to FIG. 2B). Then, the core material 32$a$ covered with the coating film 32$b$ is put into a mixed solution including silver nitrate, a complexing agent such as sulfite salt or ammonium salt, and the above-described reducing agent. Therefore, silver ions are reduced to be precipitated on the surface of the coating film 32$b$, such that the precipitated silver ions become the particles 32$c$ (refer to FIG. 2C).

Accordingly, the conductive filler 32 can be produced. Then, the conductive fillers 32 are mixed into the resin 31, thereby the conductive adhesive 30 can be produced.

In the embodiment, the electronic part 20 is mounted to the circuit board 10 such that the part electrode 21 is made to be in contact with the board electrode 11 through the conductive adhesive 30. Then, the conductive adhesive 30 is heated to be hardened so that the electronic part 20 and the circuit board 10 are bonded. Thus, the structure of FIG. 1A is formed.

The method of bonding the board electrode 11 and the part electrode 21 using the conductive adhesive 30 includes a process for preparing the conductive adhesive 30 formed by mixing the conductive fillers 32 into the resin 31, in which the filler 32 includes the core material 32$a$, the coating film 32$b$ provided on the core material 32$a$ to cover the core material 32$a$, and the particles 32$c$ provided on the surface of the coating film 32$b$.

Moreover, the method includes a process for providing the conductive adhesive 30 between the board electrode 11 and the part electrode 21, and a process for heating the conductive adhesive 30 so as to harden the resin 31 and sinter the particles 32$c$ while keeping the coating film 32$b$ on the core material 32$a$.

Figure 1B:
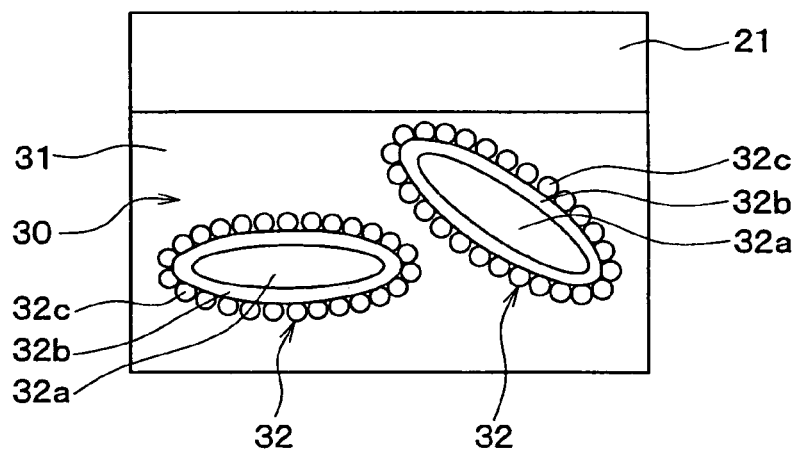
FIG. 1B is an enlarged view of the part IB in FIG. 1A, showing a state of the conductive adhesive before hardened.

As shown in FIG. 1B, before the conductive adhesive 30 is hardened, most of the conductive fillers 32 are separated from each other. When the resin 31 is hardened by heating, the conductive fillers 32 are made to be in contact with each other by a shrink accompanying the hardening of the resin 31. Also, the conductive fillers 32 and the electrodes 11, 21 are in contact with each other, thereby the electrical conduction can be performed.

Figure 1C:
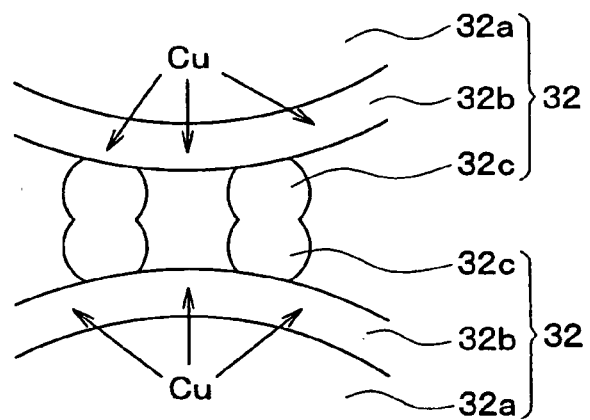
FIG. 1C is a partial view showing a state of the conductive adhesive after hardened.

Specifically, as shown in FIG. 1C, after the hardening, a metallic junction can be formed by sintering the particles 32c made of silver at the low temperature of about 150° C., because the melting temperature of the silver is relatively low. Thus, the electrical conduction between the conductive fillers 32 can be performed.

Moreover, as shown in FIG. 1C, after the bonding using the conductive adhesive 30 is performed, the copper in the core material 32a diffuses to the surface side of the conductive filler 32 by a thermal history of the hardening and a thermal history while the conductive adhesive 30 is used. Thus, an alloy of copper and silver is formed on the surface of the conductive filler 32. Therefore, a galvanic corrosion can be prevented.

In the embodiment, the surface of the core material 32a is covered with the coating film 32b made of silver, and the particles 32c made of silver are provided on the coating film 32b, so that the conductive filler 32 is produced. Accordingly, the effect of preventing the galvanic corrosion by the copper-based metal can be maintained, and the coating film 32b and the particles 32c contributing to the connection can be sintered at the lower temperature, even when the surface of the core material 32a is covered with the coating film 32b.

Thus, the surface of the core material 32a can be prevented from being exposed. Moreover, a reliability of the connection of the conductive fillers 32 can be secured, because the oxidation of the copper providing the core material 32a can be prevented, and because the metallic junction by the silver particles 32c can be adequately performed when the resin 31 is hardened.

Figure 3:
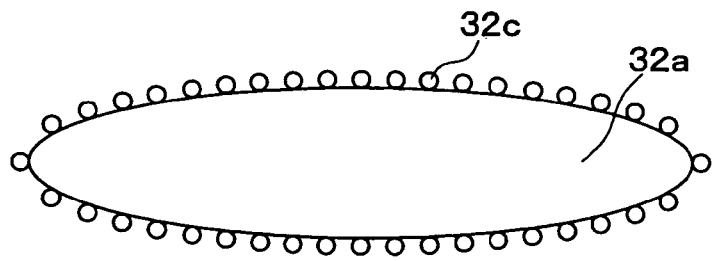
FIG. 3 is a schematic cross-sectional view showing a conductive filler of a comparative example.

FIG. 3 is a schematic cross-sectional view showing a comparative example of a conductive filler without the coating film 32b. As shown in FIG. 3, when the size of the particle 32c is not large enough to cover the entire surface of the core material 32a, clearances between the particles 32c exist. Therefore, the surface of the core material 32a not covered with the particles 32c is oxidized. Because the oxide film causes the oxidation of the particles 32c, the metallic junction by the particles 32c, i.e., the junction of the fillers, becomes insufficient.

However, in the embodiment, the metallic junction of the particles 32c is accurately formed by the hardening. Thus, an increase in the resistance of the conductive filler 32 in early use can be prevented. Also, an increase in the resistance of the conductive filler 32 after early use can be prevented, because the oxidation of the copper by heating after the hardening can also be prevented.

These specific advantages of the conductive adhesive 30 in the embodiment are experimentally examined, and the results of the experiments will be described below.

Figures 4, 6:
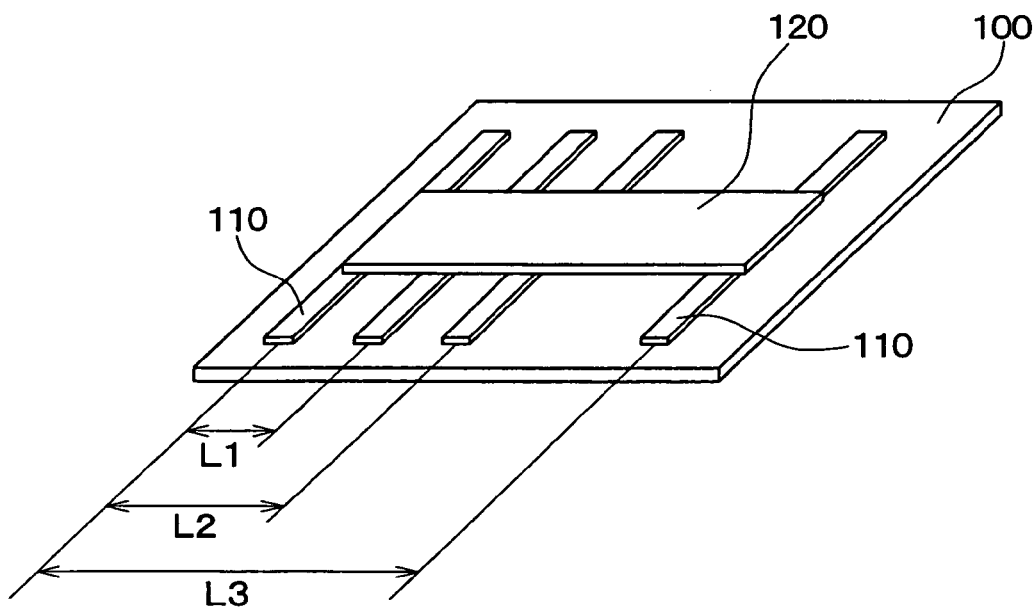
FIG. 4 is a view showing compositional ratios of conductive fillers as samples used in experiments.
FIG. 6 is a perspective diagram showing a method of measuring the volume resistivity.

FIG. 4 is a table showing compositional ratios of the conductive fillers 32 as samples used in the experiments. Samples 1-4 are the conductive fillers 32 in the embodiment, and a comparative example is the conductive filler not having the coating film 32b shown in FIG. 3.

In FIG. 4, the compositional ratio of the silver and the copper in each sample of the conductive fillers is shown. That is, the weight ratio of the silver and the copper is shown, when a total weight of the silver and the copper is defined to be 100. "TOTAL" shown in FIG. 4 means a compositional ratio analyzed with a chemical elemental analysis by melting the fillers. Therefore, "TOTAL" means a weight ratio of the silver and the copper in the total filler, and "SURFACE" shown in FIG. 4 means a weight ratio of the silver and the copper on the surface of the filler analyzed with Energy Dispersive X-ray Spectroscopy (EDX).

In FIG. 4, the weight ratios are changed between Samples 1-4. The conductive filler having a thicker coating film 32b may be better for preventing the oxidation. When the coating film 32b is thinner, the copper in the core material 32a may be easy to be oxidized.

It is difficult to accurately measure the thickness of the coating film 32b of the conductive filler 32. Therefore, in the Samples 1-4 of FIG. 4, the thickness of the coating film 32b made of silver is set to be increased by increasing the amount of the silver. Then, the effect of preventing the oxidation is examined using the weight ratio of the silver (Ag) and the copper (Cu) as a parameter.

Specifically, as shown in FIG. 4, the weight ratios of the silver to the copper in the total fillers are changed as 40:60, 50:50, 58:42 and 63:37. According to a qualitative analysis of the cross-section of the filler 32 using Scanning Electron Microscope (SEM), when the weight ratio of the copper is decreased, i.e., when the weight ratio of the silver is increased, the thickness of the coating film 32b made of silver is increased.

Figure 5:
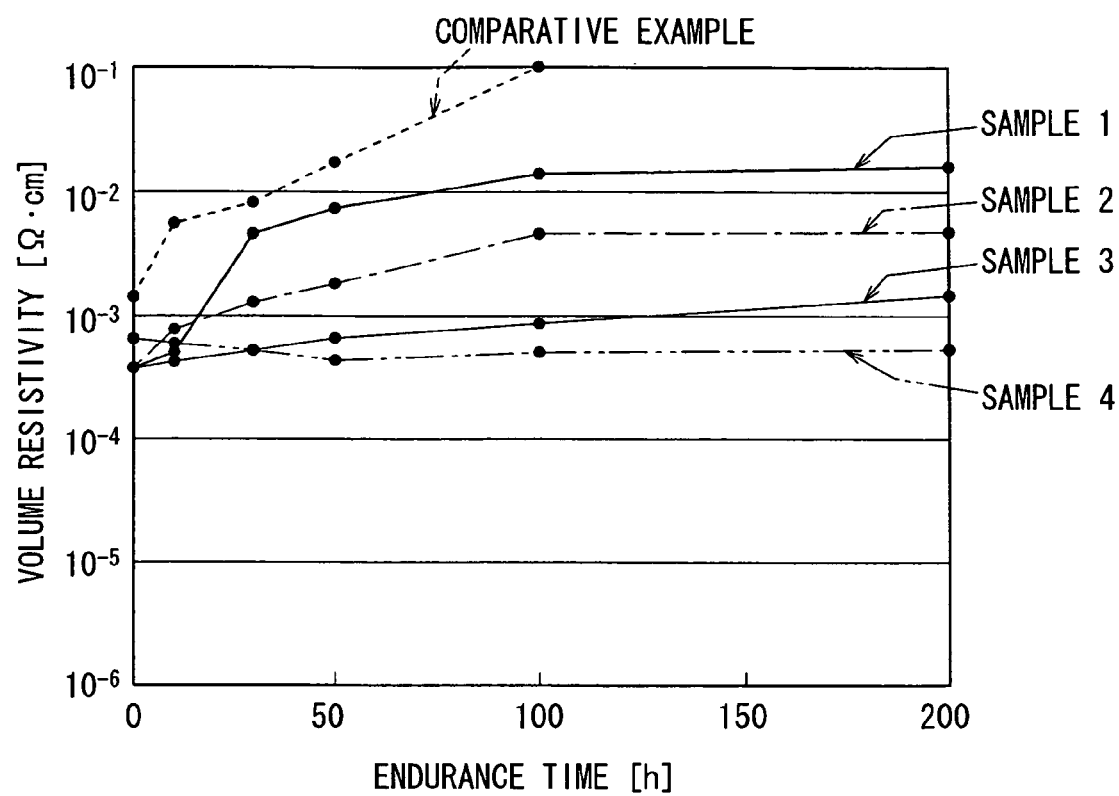
FIG. 5 is a graph showing a relationship between an endurance time and a volume resistivity, when each sample shown in FIG. 4 is tested in high-temperature endurance experiments.

FIG. 5 is a graph showing a relationship between an endurance time (hour) and a volume resistivity (unit: Ωcm), when 175° C. high-temperature endurance tests (n=3: the same test is repeated 3 times) are performed as for each sample shown in FIG. 4.

The volume resistivity is measured by a general method as shown in FIG. 6. A board 100 is prepared, on which a plurality of electrodes 110 are formed. Conductive fillers dissolved in an organic solvent such as terpineol are printed on the board 100 so that the fillers connect the electrodes 110. Then, the fillers are hardened at 150° C.

Thereby, a film 120 to be measured can be formed, in which the fillers are in a metallic junction state similar to the fillers shown in FIG. 1C. Then, resistances between different electrodes 110 having distances L1, L2 and L3 are measured. Because the distances L1-L3 and the resistances of the distances L1-L3 are in an almost linear proportional relation, the gradient of the linear curve can be used as the volume resistivity.

As shown in FIG. 5, the increase in the resistance in early use and the increase in the resistance by the thermal history over the endurance time can be reduced in the Samples 1-4, i.e., the conductive fillers 32 in the embodiment, compared with the comparative example.

Although the amount of the silver particles 32c in the comparative example is larger than that in the Samples 1-4, the increase in the resistance of the comparative example is larger than that of the Samples 1-4, because no coating film is formed in the comparative example. The coating film 32b in the embodiment has the effect of preventing the oxidation.

In addition, as shown in FIG. 5, when the weight ratio of the copper is decreased, the increase in the resistance by the thermal history over the endurance time can be reduced. This is because the effect of preventing the oxidation of the core material 32a is increased, since the thickness of the coating film 32b made of silver is relatively large, when the amount of the copper is small, as described above.

The increase in the resistance by the thermal history over the endurance time can be reduced in Samples 2-4, in which the total weight ratios of the copper are equal to or less than 50, compared with Sample 1. Specifically, the resistance of the Samples 2-4 after the endurance time of 200 hours can be reduced to be equal to or less than ten times of that at initial time (0 hour). Accordingly, in a case where the total weight of the copper and the silver in the conductive filler 32 is defined to be 100, when the weight ratio of the copper is equal to or less than 50, the resistance in the conductive adhesive 30 can be more electrically reduced.

The conductive adhesive 30 is used for the electrical connection between the electronic part and the circuit board in the embodiment. However, the conductive adhesive 30 may be used for any bonding at least first and second two members. Further, the conductive adhesive 30 may be used for a thermal connection.

Such changes and modifications are to be understood as being within the scope of the present invention as defined by the appended claims.

What is claimed is:

1. A conductive adhesive formed by mixing a plurality of conductive fillers into a thermosetting resin, the conductive filler comprising:
    a core material made of a copper-based metal;
    a coating film made of silver, wherein the coating film is provided on the core material and covers the core material; and
    a plurality of particles made of silver, wherein the particles are provided on a surface of the coating film,
    wherein the conductive filler has a weight ratio of the copper equal to or less than 50%, when a total weight of the copper and the silver is defined as 100%.

2. The conductive adhesive according to claim 1, wherein: the particle has a diameter in a range between 1 nm and 100 nm.

3. The conductive adhesive according to claim 1, wherein: the coating film has a thickness about in a range between 100 nm and 10 μm.

4. The conductive adhesive according to claim 1, wherein: the core material has a dimension equal to or lower than 25 μm.

5. A conductive adhesive form by mixing a plurality of conductive fillers into a thermosetting resin, the conductive filler comprising:
    a core material made of a copper-based metal;
    a coating film made of silver, wherein the coating film is provided on the core material and covers the core material; and
    a plurality of particles made of silver, wherein the particles are provided on a surface of the coating film,
    wherein:
    the conductive filter has a weight ratio of the silver equal to or larger than 50%, when a total weight of the copper and the silver is defined as 100%.

6. The conductive adhesive according to claim 5, wherein; the particle has a diameter in a range between 1 nm and 100 nm.

7. The conductive adhesive according to claim 5, wherein: the coating film has a thickness about in a range between 100 nm and 10 μm.

* * * * *